(12) United States Patent
Burd

(10) Patent No.: US 8,402,217 B2
(45) Date of Patent: Mar. 19, 2013

(54) IMPLEMENTING RAID IN SOLID STATE MEMORY

(75) Inventor: Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 372 days.

(21) Appl. No.: 12/881,881

(22) Filed: Sep. 14, 2010

(65) Prior Publication Data
US 2011/0066793 A1    Mar. 17, 2011

Related U.S. Application Data

(60) Provisional application No. 61/254,577, filed on Oct. 23, 2009, provisional application No. 61/242,662, filed on Sep. 15, 2009.

(51) Int. Cl.
*G06F 12/00* (2006.01)
(52) U.S. Cl. ........ 711/114; 711/103; 711/154; 711/156; 714/6.22; 714/6.24; 365/185.33
(58) Field of Classification Search .................. 711/114, 711/103, 154, 156; 714/6.22, 6.24; 365/185.33
See application file for complete search history.

(56) References Cited

U.S. PATENT DOCUMENTS

| | | | | |
|---|---|---|---|---|
| 5,737,742 A * | 4/1998 | Achiwa et al. | ................ | 711/103 |
| 7,664,903 B2 * | 2/2010 | Belonoznik | ................... | 710/315 |
| 7,702,880 B2 * | 4/2010 | Chang et al. | ................... | 711/202 |
| 8,041,884 B2 * | 10/2011 | Chang | ........................... | 711/103 |
| 8,078,794 B2 * | 12/2011 | Lee et al. | ..................... | 711/103 |
| 8,185,713 B2 * | 5/2012 | Shin et al. | ..................... | 711/167 |
| 2009/0228762 A1 * | 9/2009 | Kurashige | ..................... | 714/764 |
| 2010/0185802 A1 * | 7/2010 | Asnaashari et al. | ......... | 711/103 |
| 2010/0217919 A1 * | 8/2010 | Sukegawa et al. | ........... | 711/103 |
| 2010/0313065 A1 * | 12/2010 | Feeley et al. | .................... | 714/6 |
| 2011/0010489 A1 * | 1/2011 | Yeh | ............................... | 711/103 |
| 2011/0191521 A1 * | 8/2011 | Araki et al. | .................. | 711/103 |

OTHER PUBLICATIONS

Schwarz et al., "RAID Organization and Performance," Jun. 1992, Distributed Computing Systems, Proceedings of the 12th International Conference on Parallel and Distributed Systems, 9 pages.

* cited by examiner

*Primary Examiner* — Stephen Elmore

(57) ABSTRACT

The present disclosure includes systems and techniques relating to implementing fault tolerant data storage in solid state memory. In some implementations, a method includes receiving data to be stored, dividing data into logical data blocks, assigning the blocks to a logical block grouping comprising at least one physical data storage block from two or more of multiple solid state physical memory devices, storing the blocks in physical data storage blocks, determining a code that corresponds to the persisted data, and storing the code that corresponds to the data stored in the logical block grouping. Blocks of damaged stored data may be recovered by identifying the logical data block and logical block grouping corresponding to the damaged physical data storage block, reading the data and the code stored in the identified grouping, and comparing the code to the read data other than the data stored in the damaged block.

20 Claims, 14 Drawing Sheets

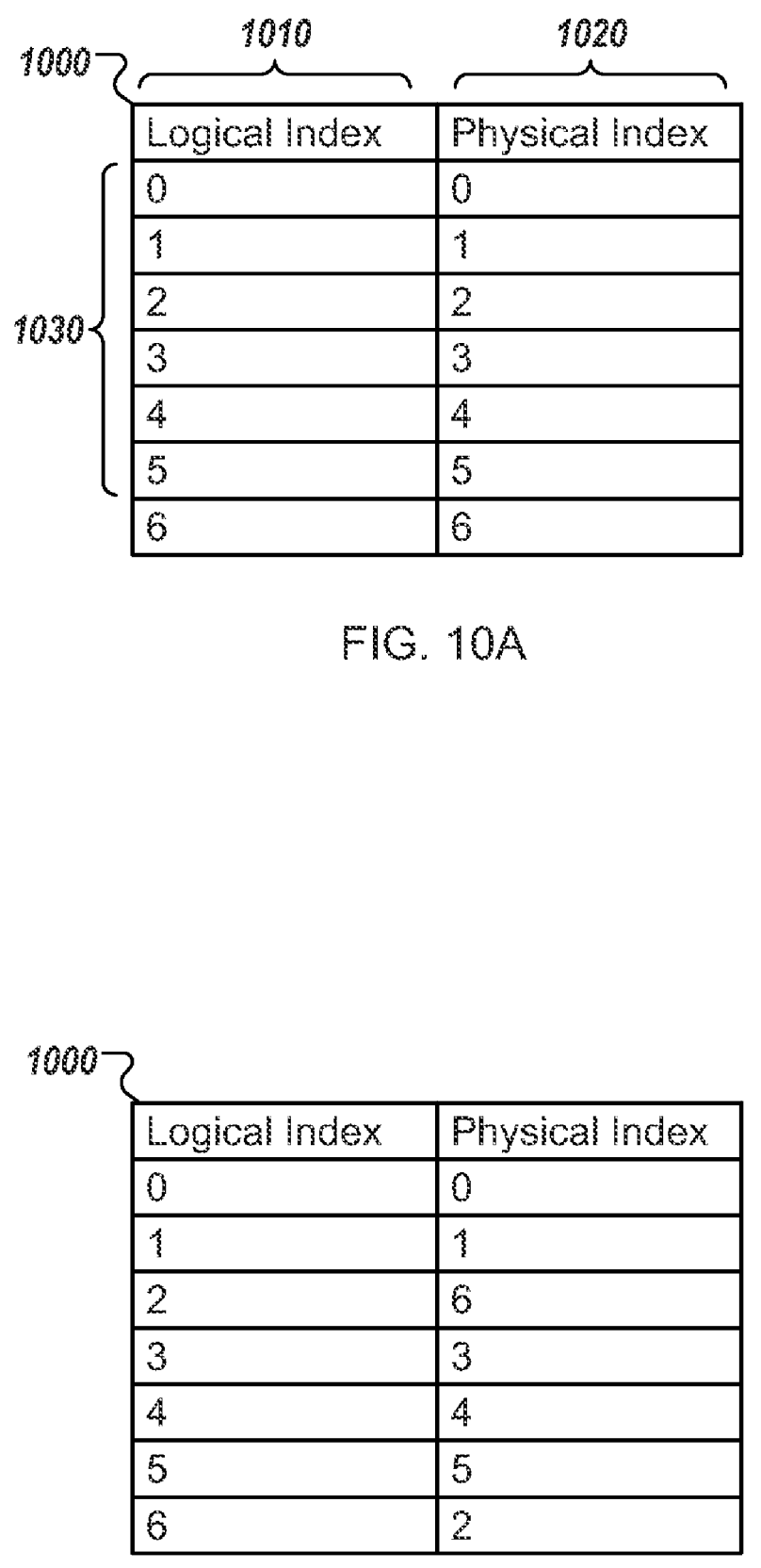

1000

| Logical Index (1010) | Physical Index (1020) |
|---|---|
| 0 | 0 |
| 1 | 1 |
| 2 | 2 |
| 3 | 3 |
| 4 | 4 |
| 5 | 5 |
| 6 | 6 |

(1030 brackets logical indices 0–5)

| Logical Index | Physical Index |
|---|---|
| 0 | 0 |
| 1 | 1 |
| 2 | 6 |
| 3 | 3 |
| 4 | 4 |
| 5 | 5 |
| 6 | 2 |

FIG. 10B

IMPLEMENTING RAID IN SOLID STATE MEMORY

CROSS REFERENCE TO RELATED APPLICATION

This application claims the benefit of the priority of U.S. Provisional Application Ser. No. 61/242,662, filed Sep. 15, 2009 and entitled "IMPLEMENTING RAID INSIDE SSD" and claims the benefit of the priority of U.S. Provisional Application Ser. No. 61/254,577, filed Oct. 23, 2009 and entitled "IMPLEMENTING RAID INSIDE SSD"; the entire contents of both priority applications are hereby incorporated by reference.

BACKGROUND

Computer systems often generate data that needs to be stored persistently. System settings, digital photographs, electronic documents, and digital videos are all examples of electronic files that most users of computer systems would wish to store persistently. In a typical personal computer, these and other types of electronic files are stored on a hard disk drive, or increasingly, on a solid state memory device (e.g., a flash drive).

One concern for computer users is the loss of electronic files and data. Hard drives are mechanical devices that, like any other machine, are subject to wear or damage that can lead to a malfunction wherein the information they contain may become partly or completely inaccessible. The likelihood of data loss is sometimes reduced through the use of a redundant array of independent drives (RAID). RAID is a technique wherein multiple hard drives are combined into a larger logical unit, and provides increased reliability though redundancy. Data that is stored to the logical unit is distributed among the multiple drives along with error recovery data. If one physical hard drive fails, only the portions of the data stored to that drive become inaccessible. The inaccessible data is able to be recovered or recreated based on the error recovery data stored on the remaining drives.

SUMMARY

The present disclosure includes systems and techniques relating to fault tolerant systems and methods for storing data in solid state memory, such as FLASH memory. According to an aspect of the described systems and techniques, an electronic device for storing data includes an input port configured to receive data, a comparison buffer memory to hold a comparison value, a comparison circuit to compare each of multiple logical blocks, into which the data is divided, to the comparison value to determine a new comparison value to hold in the comparison buffer memory, and a solid state data storage memory to store the logical blocks and a recovery code corresponding to the comparison value, wherein data from at least one of the stored logical blocks is recoverable by combining data from one or more unselected ones of the stored logical blocks and the recovery code.

Various implementations can include some, all, or none of the following features. The solid state data storage memory can be a FLASH memory. The comparison circuit can perform a logical XOR operation. The buffer memory can include multiple buffer memories, and at least one of the buffer memories can include a single port memory. The recovery code can be determined by determining a value that, when compared to the comparison value, results in a predetermined value. The device can include a processor programmed by software to effect the comparison circuit, wherein the comparison circuit can perform a logical XOR operation.

The solid state data storage memory can include multiple solid state physical memory devices. Each of the multiple solid state physical memory devices can include a single integrated circuit die including at least one physical data storage block, wherein a physical data storage block can include a block of solid state memory formed on the integrated circuit die and is individually addressable along with other blocks of solid state memory formed on the same integrated circuit die. The device can interface with a host device as a single data storage device.

According to another aspect of the described systems and techniques, a method includes receiving, at a storage controller, data to be stored in solid state memory including multiple solid state physical memory devices, dividing, by the storage controller, the received data into logical data blocks corresponding to the solid state memory, assigning, by the storage controller, the logical data blocks to a logical block grouping including at least one physical data storage block from two or more of the multiple solid state physical memory devices, storing the logical data blocks in physical data storage blocks, of the logical block grouping, designated for storage of persisted data within the logical block grouping, determining, by the storage controller, a code that corresponds to the persisted data stored in the logical block grouping, and storing, by the storage controller, the code in at least one physical data storage block designated for storage of the code that corresponds to the persisted data stored in the logical block grouping.

Various implementations can include some, all, or none of the following features. The multiple solid state physical memory devices can be FLASH memory devices. The determining can be a logical XOR operation. The multiple solid state physical memory devices and the storage controller can be a single memory storage device. The multiple solid state physical memory devices can be a single integrated circuit die including at least one physical data storage block, wherein a physical data storage block can include a block of solid state memory formed on the integrated circuit die and can be individually addressable along with other blocks of solid state memory formed on the same integrated circuit die.

The method can also include recovering, by the storage controller, the persisted data stored in a selected physical data storage block by identifying the logical block grouping to which the logical data block corresponding to the selected physical data storage block is assigned, reading the persisted data and the code stored in the identified logical block grouping, and comparing the code to the read persisted data other than the persisted data stored in the selected physical data storage block. The comparing can be a logical XOR operation. Determining the code can include storing, in a buffer memory, a first logical data block of the logical block grouping as a buffered value for each of the remaining logical data blocks in the logical block grouping, comparing, by the storage controller, the remaining logical data block to the buffered value to determine a comparison value, and storing the comparison value as the buffered value in the buffer memory, and determining, by the storage controller, a value that, when compared to the buffered value, results in a predetermined value. The buffer memory can include multiple buffer memories, and at least one of the buffer memories can include a single port memory.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus and system implementations can be realized from a disclosed method, computer-readable medium, or apparatus.

For example, the disclosed embodiment(s) below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

The described systems and techniques can result in increased fault tolerance and recoverability of data stored in a solid state memory device (e.g., in the event of a failure of a component or memory block within the device). The physical structure of the solid state memory device can be advantageously used to reduce the complexity of the methods used in previous RAID systems by inherently providing structures that can be treated similarly to RAID devices and stripes. The storage controllers already used in some solid state memory devices can be adapted to calculate, store, and use the parity values using existing data paths. Techniques already used for facilitating the even wear of memory locations can also be leveraged to remove the need for the explicit workload distribution and wear leveling across the hard drives that is needed by existing RAID systems. Additionally, since solid state memory devices are not mechanical, rotating devices, there is no need to synchronize the devices (e.g., synchronize the spindles) like there is in some hard disk based RAID implementations.

Details of one or more implementations are set forth in the accompanying drawings and the description below. Other features, objects and advantages may be apparent from the description and drawings, and from the claims.

DRAWING DESCRIPTIONS

FIGS. 10A and 10B show examples of a look up table for mapping logical indexing to physical indexing.

Like reference symbols in the various drawings indicate like elements.

DETAILED DESCRIPTION

The systems and techniques described herein can be implemented as one or more devices, such as one or more integrated circuit (IC) devices in solid state memory devices (e.g., a FLASH drives, a USB storage devices, a solid state drives).

Figure 1:
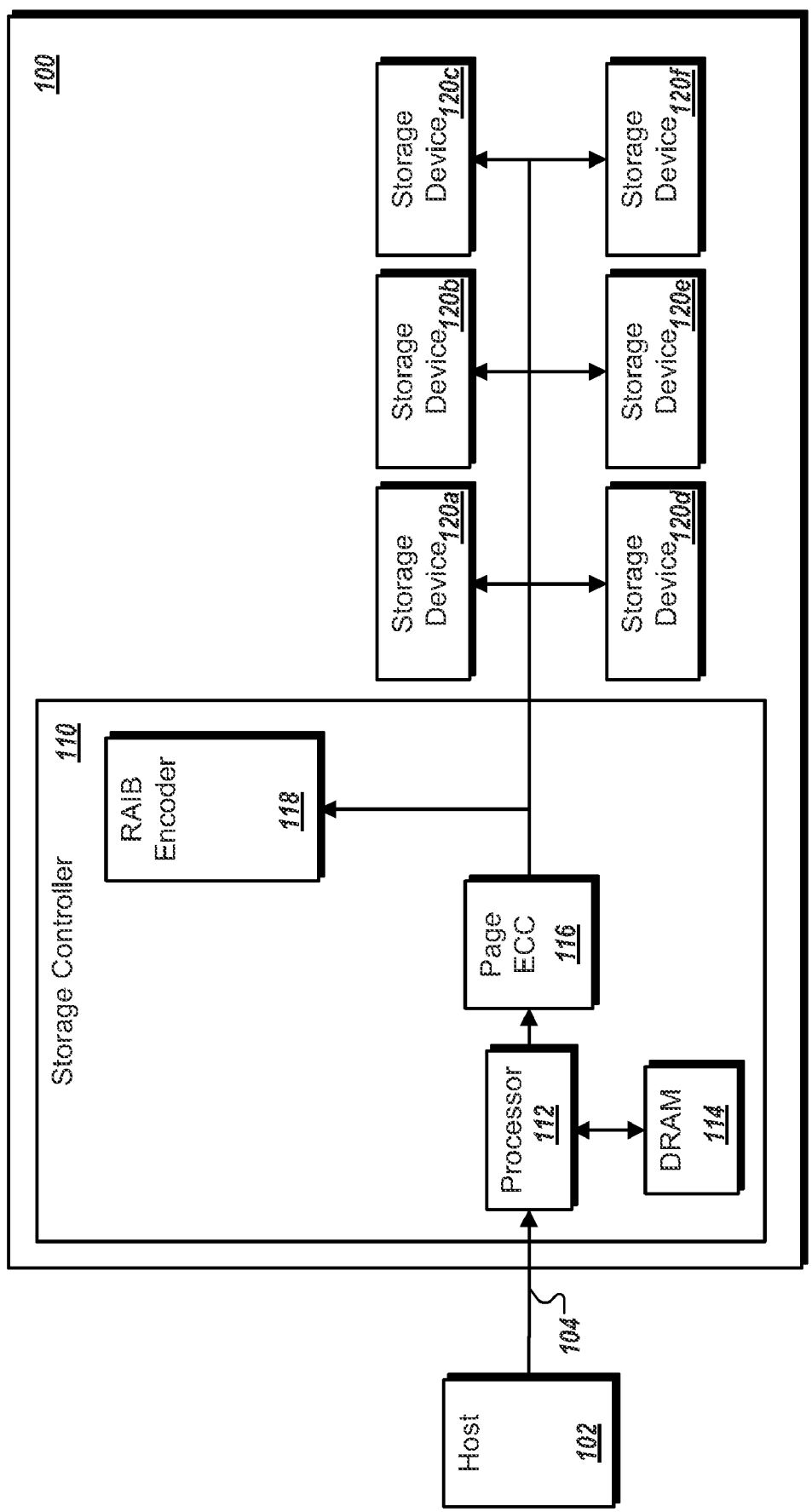
FIG. 1 is a block diagram showing an example of a fault tolerant solid state memory device.

FIG. 1 is a block diagram showing an example of a fault tolerant solid state memory device 100. In general, the device 100 is a data storage device that uses solid state memory components and related circuitry to provide nonvolatile storage of user and other data. Examples of solid state memory devices that can be embodied by the device 100 include devices commonly referred to as "flash drives", "USB drives", "thumb drives", or solid state disk drives (SSD drives). The device 100 gains its fault tolerance at least in part by distributing data that is to be stored among multiple memory storage subcomponents, while also calculating and storing error correction (e.g., parity) codes that describe the stored data. Since solid state memory devices, such as the device 100, are made up of multiple solid state (e.g., flash) memory device subcomponents, a redundant array of independent blocks (RAIB) can be realized within a single SSD, as opposed to a group of solid state drive as is the case with RAID systems. In the event of a failure of a memory storage subcomponent, the parity information can be used as part of a process to recover the data stored in the failed subcomponent.

The device 100 is communicatively connected to a host device 102 (e.g., a computer) by an input port 104. In some implementations, the input port 104 can be a universal serial bus (USB), a serial ATA (SATA) bus, a parallel ATA (PATA) bus, FireWire, or any other serial or parallel data bus.

The device 100 includes a storage controller 110. The storage controller 110 interfaces the host 102 to a collection of storage devices 120a-120f, such that the host 102 is able to use the storage devices 120a-120f for storage of data. Each of the storage devices 120a-120f is a solid state memory device, each of which may include one or more blocks of physical memory. In some embodiments, the storage devices 120a-120f can be flash memory devices, NAND devices, or other appropriate types of solid state memory devices. Additional examples of storage devices will be discussed further in the description below in connection with FIGS. 3 and 4. In some implementations, the storage controller 110 can organize the storage devices 102a-120f to interface with the host 102 as one or more storage devices.

Each of the flash devices 120a-120f is subdivided into logical data blocks. In some implementations, a logical data block represents the smallest erasable unit of solid state memory within one flash devices 120a-120f. Each block is partitioned into pages. In some implementations, a page may be the smallest unit of memory that can be read or written to a block. In some examples, a block may have 192 4 KB pages. Examples of logical data blocks will be discussed in the description below in connection with FIG. 4.

The storage controller 110 includes a processor 112, a dynamic random access memory (DRAM) 114, a page error-correcting code (ECC) module 116, and a redundant array of independent blocks (RAIB) encoder 212. The processor 112 receives data from the host 102 and buffers the data in the DRAM 114. In some implementations, the DRAM 114 may be external to the storage controller 110. The processor 112 then processes data received from the host 102 or read from the DRAM 114 by dividing, grouping, or otherwise associating the data into one or more logical data blocks, determining subsets of the flash devices 120a-120f in which to store the logical data blocks as logical block groupings, and storing the data therein. Examples of logical groupings will be discussed further in the description below in connection with of FIG. 4.

As the data is sent to the storage devices 120a-120f, the data passes through the page ECC module 116. The page ECC module 116 adds error correction code redundancy to each page being sent to the storage devices 120a-120f for storage, and stores the ECC redundancy along with each page. In some implementations, the ECC codes can be used to detect and repair errors within the associated page. For example, an ECC code can be used in a process to determine which bits within the page were stored or read erroneously, and recover the originally stored data within the page.

In some implementations, ECC can be done on a wordline level. For example, for single bit cell (e.g., single level cell, SLC), there can be one page per wordline. However, in some examples flash devices can be capable of storing two bits (e.g., multi-level cell, MLC), three bits (e.g., three layer cell, TLC), or more bits per cell. Such devices can have wordlines (e.g., rows of cells) that are capable of holding multiple pages. For example, one page can correspond to the least significant bit (LSB) of each cell, while another page corresponds to a center bit, and yet another page corresponds to most significant bit (MSB) of each cell. In examples of TLC or MLC, page level ECC or word-line level ECC can be used.

In addition to the protection that the ECC codes provide for individual pages stored on the storage devices 120a-120f, the RAIB encoder 118 process pages to produce RAIB redundancy codes (e.g., error correction code parity data) for logical block groupings. The controller may then store the user data and RAIB redundancy computed by encoder 118 using two or more of the storage devices 120a-120f.

In some implementations, at a given time there may be only one active logical block grouping. The data may then be written page by page while interleaving the pages across the physical memory blocks of a logical block grouping. In some implementations, increased throughput and/or reliability may be achieved if blocks within a logical block grouping reside on different storage devices 120a-120f. Once corresponding pages of user data have been written to the storage devices 120a-120f, RAIB parity is available and is written by the controller onto corresponding page(s) of the storage devices 120a-120f.

In some implementations, the processor 112 may request the RAIB encoder 118 to write parity data to the storage devices 120a-120f before all the user pages have been written to the storage devices 120a-120f. In such an example, the empty user pages may be marked as used. For example, writing to used user pages would invalidate the RAIB error correction code structure due to the fact that the RAIB encoder 118 would not be able to update RAIB redundancy since a page can only be written once between two successive block erase operations.

In some implementations, the processor 112 or the host 102 may process the data to determine error correction data and/or control the distribution and storage of the error correction data. For example, the processor 112 or the host 102 may emulate the functions of the RAIB encoder 118 to group logical data blocks across different devices into logical groupings, and introduce an error correction code for each such logical grouping.

Figure 2:
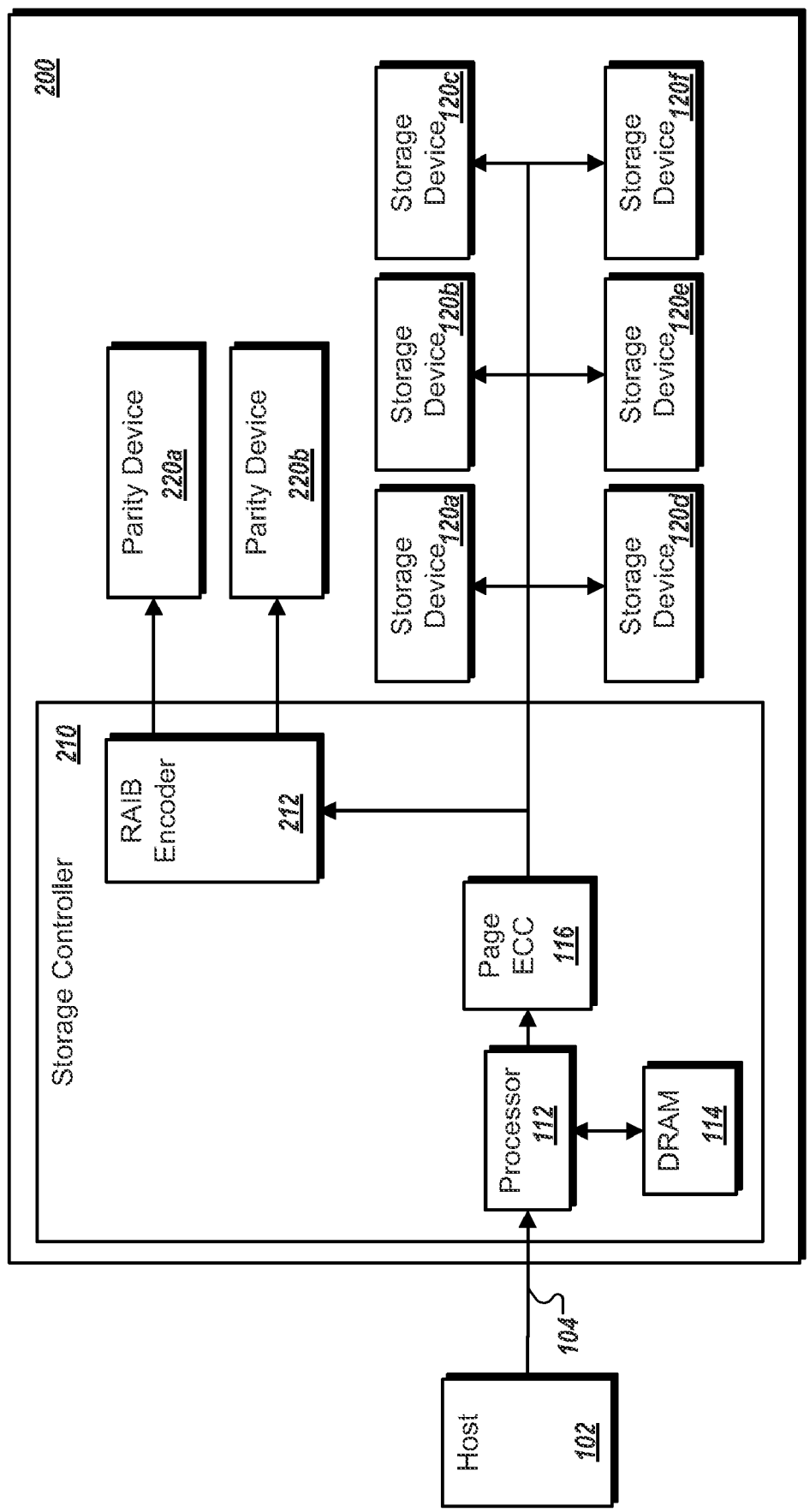
FIG. 2 is a block diagram showing another example of a fault tolerant solid state memory device.

FIG. 2 is a block diagram showing another example of a fault tolerant solid state memory device 200. The device 200 interfaces with the host 102 through the data bus 104 to provide solid state memory storage for the host 102.

The device 200 includes a storage controller 210. The storage controller 210 includes the processor 112, the DRAM 114, and the page ECC module 116. The storage controller 210 also includes a redundant array of independent blocks (RAIB) encoder 212.

The RAIB encoder 212 performs substantially the same functions as the RAIB encoder 118 of FIG. 1, except in this example the controller stores RAIB parity in a dedicated parity device 220a and 220b. In some implementations, the parity devices 220a-220b are storage devices, similar to the storage devices 120a-120f, that are reserved for the storage of RAIB parity data. The RAIB parity data stored on the parity devices 220a-220b can be used later to recover data stored on the storage devices 120a-120f.

Figure 3:
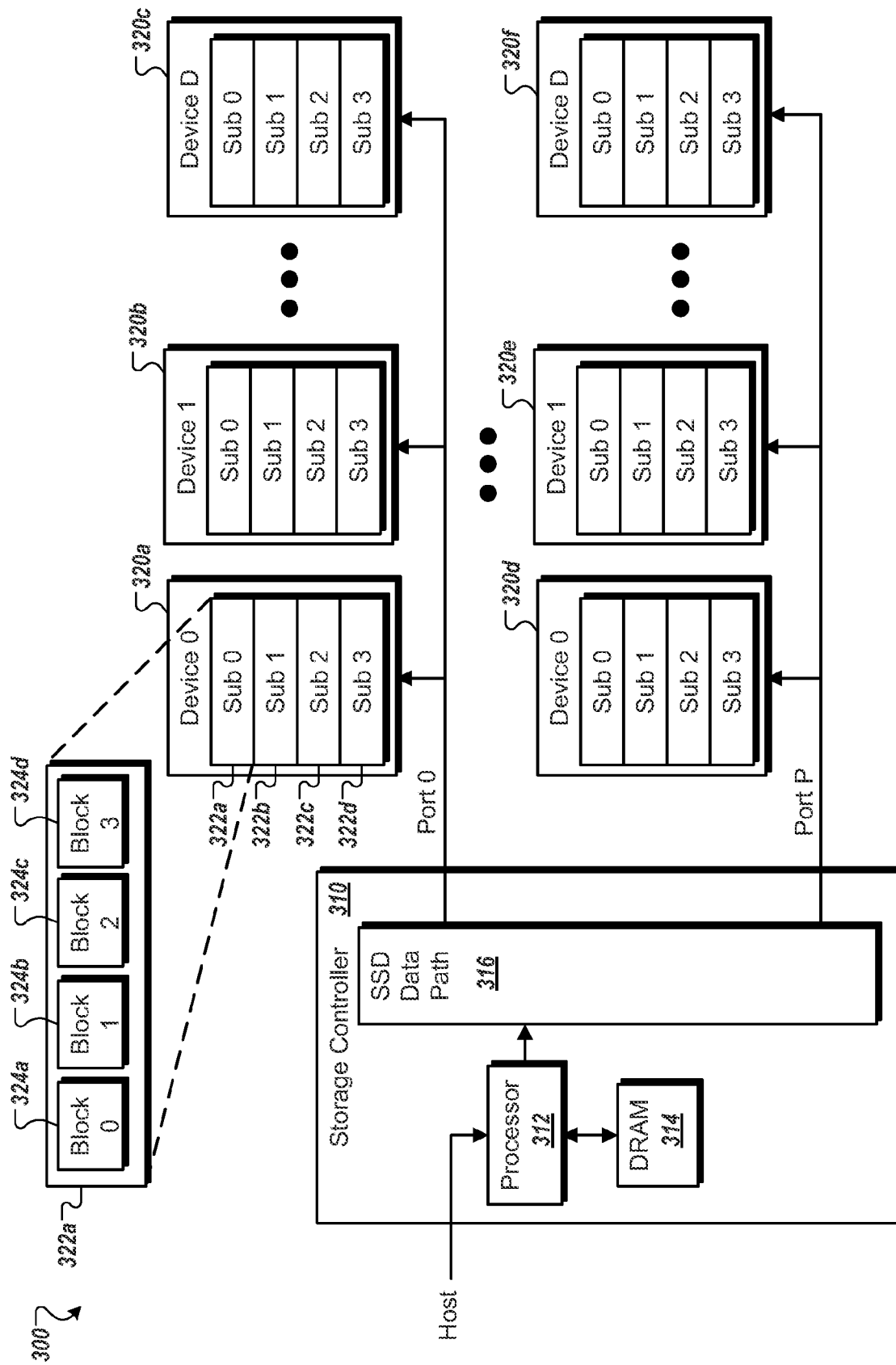
FIG. 3 is a block diagram showing an example of a fault tolerant solid state memory device that includes multiple solid state memory devices.

FIG. 3 is a block diagram showing an example of a fault tolerant solid state memory device 300 that includes multiple storage memory devices. In general, the concept of fault tolerance in devices such as the device 300 is to link the data stored on different storage devices within the device by RAIB parity data. In some implementations, fault tolerance techniques (e.g., RAID) may be prefaced on an assumption that storage module failures can be independent. In some implementations of fault tolerant solid state memory devices such as the devices 100, 200, and 300, a logical way to segregate storage devices can be done by treating each storage device module, or each die, within the devices 100, 200, and 300 as a device that is able to fail independently from other similar devices within the same fault tolerant solid state memory device.

The device 300 includes a storage controller 310, and a collection of storage devices 320a-320f. The storage controller 310 includes a processor 312 and a DRAM 314. In some implementations, the processor 312 and the DRAM can be the processor 112 and the DRAM 114 respectively. The storage controller 310 also includes a solid state device data path 316. In some implementations the solid state device data path 316 can coordinate the distribution of user data and recovery codes to storage locations among the storage devices 320a-320f.

Each of the storage devices 320a-320f includes multiple storage sub-devices, such as the storage sub-devices 322a-322d in 320a. In some implementations, each of the storage sub-devices 322a-322d can be a single integrated memory circuit, or die. Each of the storage sub-devices is further subdivided into a number of memory blocks, such as memory blocks 324a-324d in the storage sub-device 322a. In some implementations, a physical storage block can include the collection of memory blocks 324a-324d, wherein the memory blocks 324a-324d are individually addressable and are all formed on the same integrated circuit die. In some implementations, each of the memory blocks 324a-324d represents a grouping of the smallest erasable unit on the storage sub-device 322a, and each of the memory blocks 324a-324d includes a number of pages (not shown) that represent the smallest writeable unit of memory within the memory block.

In some implementations, the physical structure of the device 300, and more particularly the storage devices 320a-320f, can be taken advantage of for the purposes of creating a fault tolerant storage system. For example, since flash memory generally cannot be overwritten on a page level, once every block has been written the entire block has to be erased before new data can be written onto its pages, therefore there may be no need to consider the use case where some blocks have been modified and the RAIB parity has to be updated accordingly. In another example, the design of the device 300 might not need to accommodate inserting, deleting, or replacing blocks containing user data or RAIB parity data as is generally done in RAID controllers since once the device 300 has been manufactured, it may not be possible to add or remove memory devices.

Figure 4:
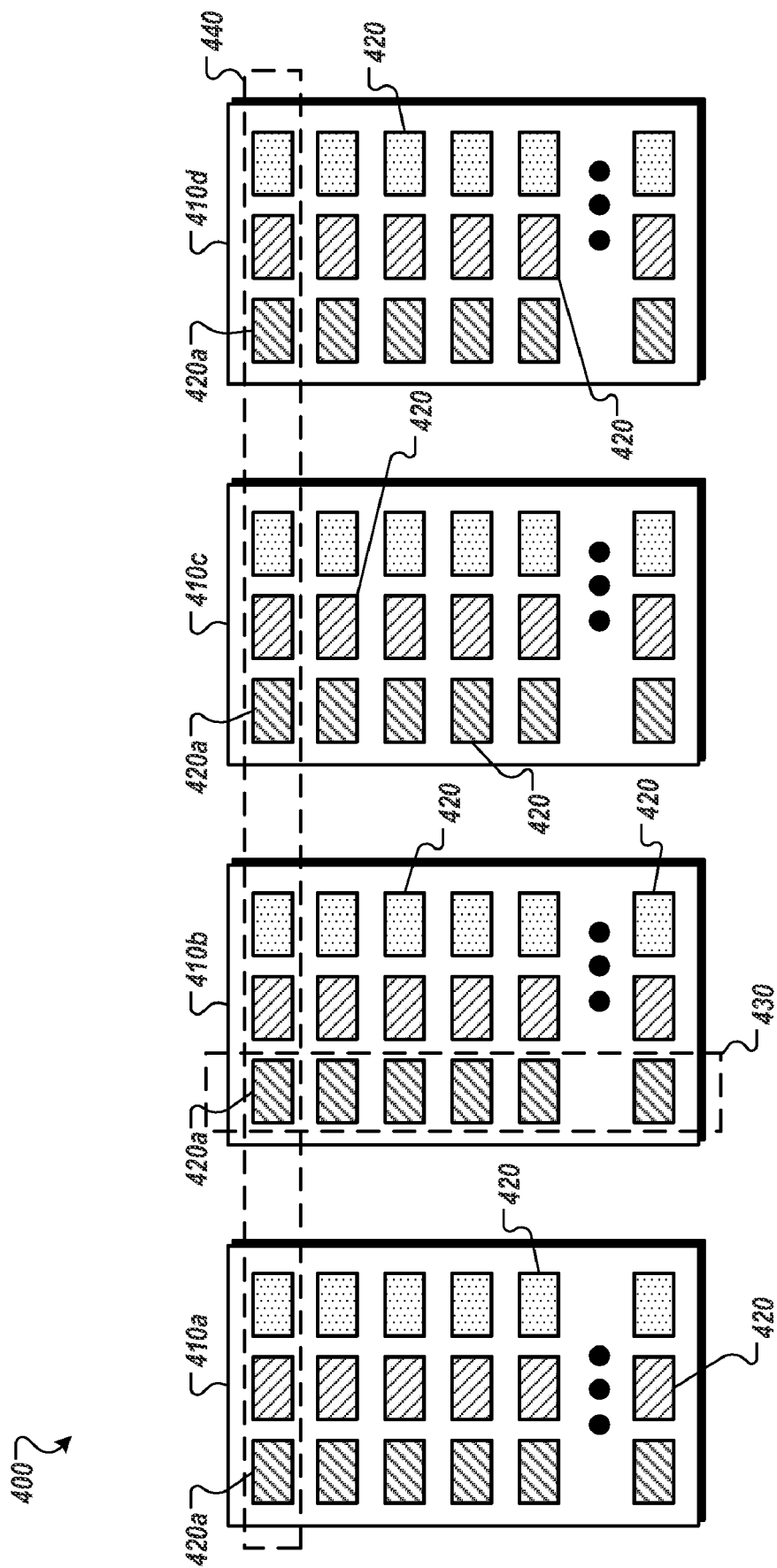
FIG. 4 shows a conceptual logical grouping of several solid state memory devices.

FIG. 4 shows a conceptual logical grouping 400 of several solid state memory devices. In general, the grouping represents a logical arrangement of the memory devices within a fault tolerant solid state memory device to show an example of logical grouping of memory blocks to provide fault tolerance. In some implementations, the grouping 400 can be used by the devices 100, 200, and/or 300 of FIGS. 1, 2, and 3, respectively.

The grouping 400 includes a storage device 410a, a storage device 410b, a storage device 410c, and a storage device 410d. In some implementations, the storage devices 410a-410d can be storage devices substantially similar to the storage devices 120a-120f of FIG. 1. In some implementations, one or more of the storage devices 410a-410d can be the parity devices 220a-200b of FIG. 2.

Each of the storage devices 410a-410d includes a collection of physical memory blocks 420. The physical memory blocks 420 are illustrated in a conceptual arrangement of rows and columns, where each storage device (e.g. die) 410a-410d consists of multiple blocks. In some implementations, a storage device can be used to represent a parallelization structure, for example, the collection of memory units within a single storage memory device that can be written or read at the same time (e.g., multi-plane device). For example, a column 430 represents the physical memory blocks incorporated into the storage device 410b.

The rows of the physical memory blocks 420, such as a row 440 represent logical units of memory that include a corresponding block (e.g., the $k^{th}$ block) within each sub-device. In some implementations, the row 440 represents a logical unit (or a subset thereof as might be the case where there are two planes per device) of memory that can be erased at once.

The row 440 is also used as a logical block grouping of the physical memory blocks 420 for purposes of fault tolerance (e.g., a RAIB stripe, or RAIB ECC code word). A storage controller such as the storage controller 110, 210, or 310, uses the row 440 to store user data and RAIB redundancy. For example, user data can be divided into blocks that correspond to the size and number of physical memory devices 420 that are designated for storage of user data within the row 440. More specifically, user data may be written into these blocks one page at a time in the interleaved manner (e.g., first write 0-th page of each block, then write 1-st page of each block, etc.). The storage controller may compute RAIB parity page by performing bitwise XOR operation on the user pages. The storage controller can then store RAIB parity page onto the last free block within row 440 (e.g., not necessarily the right most block as shown on the FIG. 400).

In some implementations, the design of a fault tolerant solid state memory device may be partly predicated on the notion that data can be lost due to the failure of a physical device. For example, one of the physical memory blocks 420 may malfunction, making the data it stores corrupt or inaccessible. In another example, an entire plane on one device may malfunction, thereby causing the physical memory blocks 420 within the plane to be unreadable.

However, in some implementations, it may not be feasible to assume that all the planes within the same device are independent (e.g., all the planes within the storage device 410a may be unreadable if the storage device 410a were to malfunction). In order to accommodate such design considerations, several RAIB stripes can be interleaved within a single row in such a way that each RAIB code word does not contain bits from two or more planes on a single storage device module.

For example, the logical assemblage of the row 440 includes one physical memory block 420 from each storage device module. The physical memory blocks 420 belonging to a single RAIB stripe within each row are shown with similar fill patterns. For example, a collection of physical memory blocks 420a represent the physical memory blocks 420 that belong to a stripe that is interleaved into the row 440 such that no more than one physical memory device from any of the storage devices 410a-410d is included in a single RAIB stripe.

In the example of FIG. 4, each row is broken into three RAIB stripes shown with different fill patterns, and each physical unit (e.g., each storage device 410a-410d) within a RAIB stripe is independent from the other physical units from a failure point of view. More generally, storage devices with N sub-devices can provide N RAIB stripes per row.

In the present example, the storage devices 410a-410d are designated for storage of user data and recovery codes. In some implementations, the storage controller may determine which of the physical memory blocks 420 are to be used for the storage of RAIB parity. In some implementations, more than one physical memory block 420 may be used for storing parity for a single RAIB stripe. For example, a RAIB stripe using one block of recovery code may generally be able to recover the data in a single failed physical memory block within the RAIB stripe. By implementing codes capable of recovering two or more failed blocks per RAIB stripe, a corresponding two or more bad blocks can be recovered.

In some implementations, this relationship may be referred to as a RAIB coderate. Single block correcting RAIB coderate is given by (number of devices in a RAIB stripe−1)/(number of devices in a RAIB stripe). For example, for a fault tolerant solid state memory device having eight flash devices, the RAIB coderate would be (8−1)/8, or 7/8, which means that about 12% of the entire device would be used to store recovery codes. In an example where two of the eight flash devices are used to store RAIB parity, then the RAIB coderate would be (8−2)/8, or 3/4, which means that about 25% of the entire device would be used for storage of recovery codes. In implementations where more than one block of recovery codes is used, a Reed-Solomon (RS) code may be used to implement RAIB ECC.

Referring still to FIG. 4, in some implementations a RAIB stripe can be chosen to coincide with the row 440 such that the RAIB redundancy occupies a single plane (e.g., sub-device) to yield a higher RAIB coderate (e.g., a smaller fraction of space dedicated to storage of recovery codes) at the expense of reduced data reliability protection due to the possibility of multiple plane failures on the same device. For example, for a fault tolerant solid state memory device with 16 flash devices and two planes per device, this may yield a 31/32 RAIB coderate system. In some implementations, the RAIB coderate can be configurable in response to user selection.

In some implementations, it may be desirable to select RAIB stripes to coincide or to be a subset of a logical block grouping used by the controller to carry out memory management (e.g., wear-leveling, garbage collection). Since all the pages within a RAIB stripe may need to be invalidated before any member block can be erased, in some implementations, erasing some of the blocks within the RAIB stripe may result in loss of RAIB recovery code protection. This functionality may be inherent if all the devices within RAIB stripe belong to a single wear leveling unit. In some implementations, the storage controller can group like data within a RAIB stripe (e.g., hot data with hot, cold data with cold), and select like blocks (e.g., blocks with the substantially similar cycle characteristics) to form a stripe.

Many of the examples described so far have implemented a single block correcting RAIB. In some implementations, a RAIB ECC may be designed that is capable of recovering more than a single block within RAIB stripe. For example, a Reed-Solomon (RS) ECC code may be used to encode a k-th symbol (e.g. 8 bit symbol) of pages within a RAIB stripe. In some implementations, the usage of RS ECC codes with generating polynomial of degree N can yield a RAIB stripe that is capable of correcting 2N block failures, assuming failed blocks can be identified (e.g., by utilizing page level/wordline level ECC).

Figure 5A:
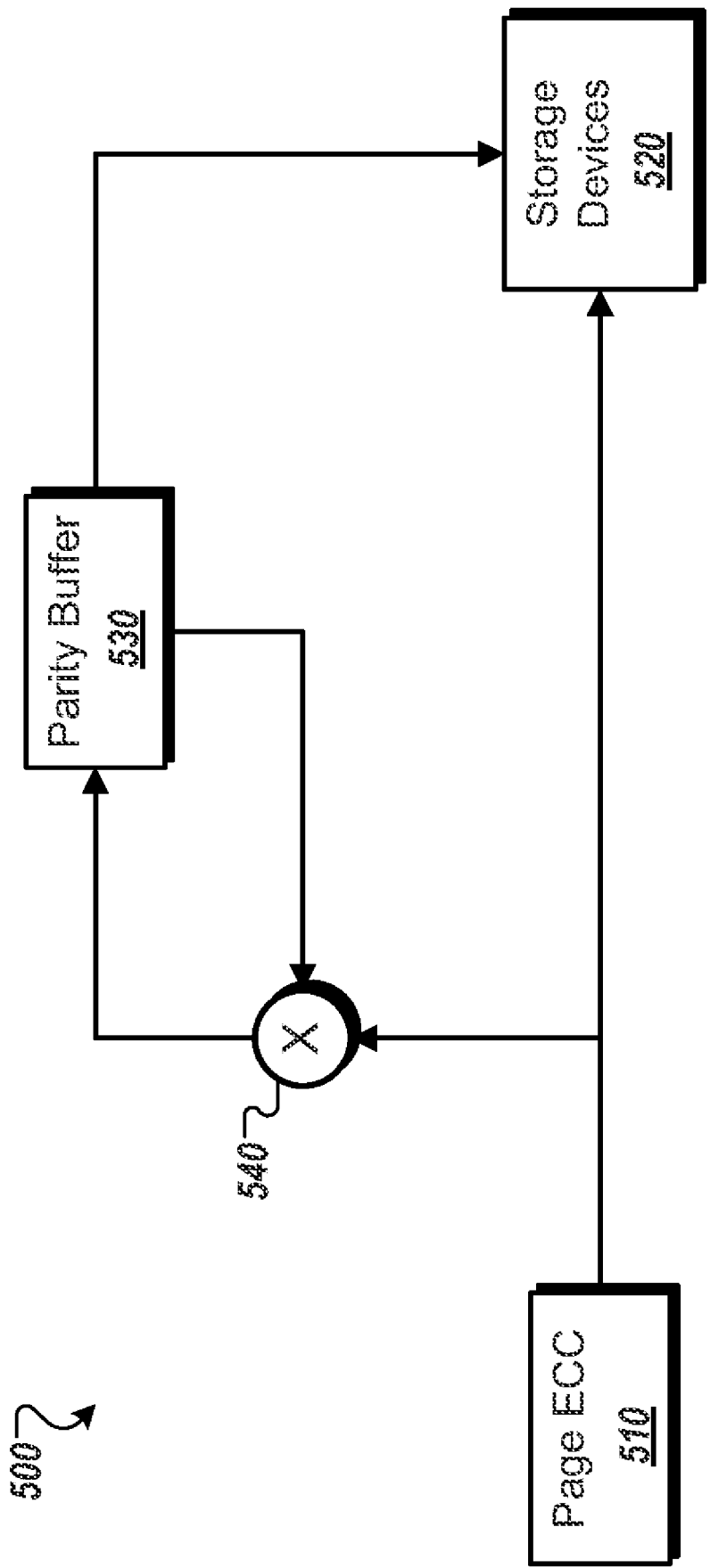
FIGS. 5A and 5B are block diagrams showing examples of parity encoders.

FIG. 5A is a block diagram showing an example of a parity encoder 500. In some implementations, the parity encoder 500 can be included in the storage controllers 110, 210, or 310. In general, the parity encoder 500 XOR's pages of user data to produce a page of RAIB redundancy code. In the present example, the parity encoder 500 is configured to produce a single parity check code for the determination of a single block correcting recovery code.

The write path 500 includes a page ECC encoder 510. In some implementations, the page ECC encoder 510 can be the page ECC encoder 116 of FIG. 1. The page ECC encoder 510 processes pages of user data to determine error correction code redundancy for a page level ECC. In some implementations, the ECC codes can be used to correct errors within individual pages of user data. User data and page level ECC redundancy bits are then stored in a collection of storage devices 520.

The write path 500 maintains a RAIB parity buffer 530 that stores a partial RAIB parity values. For example, before the first user page of a logical block grouping is written, the parity buffer 530 is reset to zero. As user pages come in, the parity buffer 530 is updated by performing a XOR operation 540 between the content of the parity buffer 530 and the incoming page. Once the last user page of a logical block grouping (e.g. RAIB stripe) has been written, the content of the parity buffer 530 is written to the storage devices 520

Figure 5B:
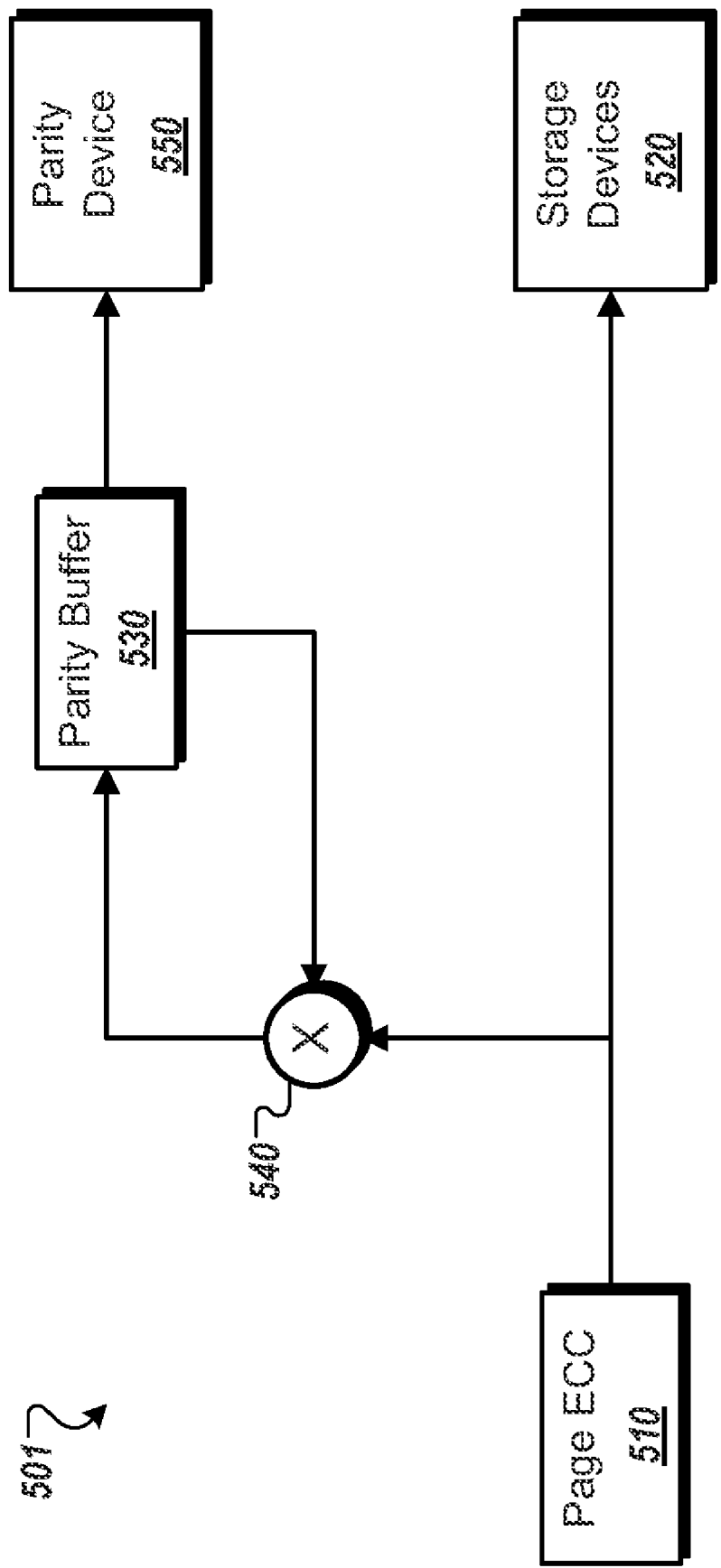

FIG. 5B is a block diagram showing an example of another parity encoder 501. The parity encoder 501 is substantially similar to the parity encoder 500, except that once the last user page of a logical block grouping has been written, the content of the parity buffer 530 is written to a dedicated parity device 550. In some implementations, additional parity devices 550 can be included to guard against multiple device failures. An equal or greater number of additional parity buffers 530 can also be implemented, wherein each parity buffer 530 can be updated in a similar manner as described previously, with additional control to enable or disable the XOR 540 operation depending on the look up table and the user page index. An example of multiple parity buffers will be discussed further in the description of FIG. 9. An example of a look up table and user page indexes will be discussed in the description below in connection with FIGS. 10a and 10b.

Figure 6:
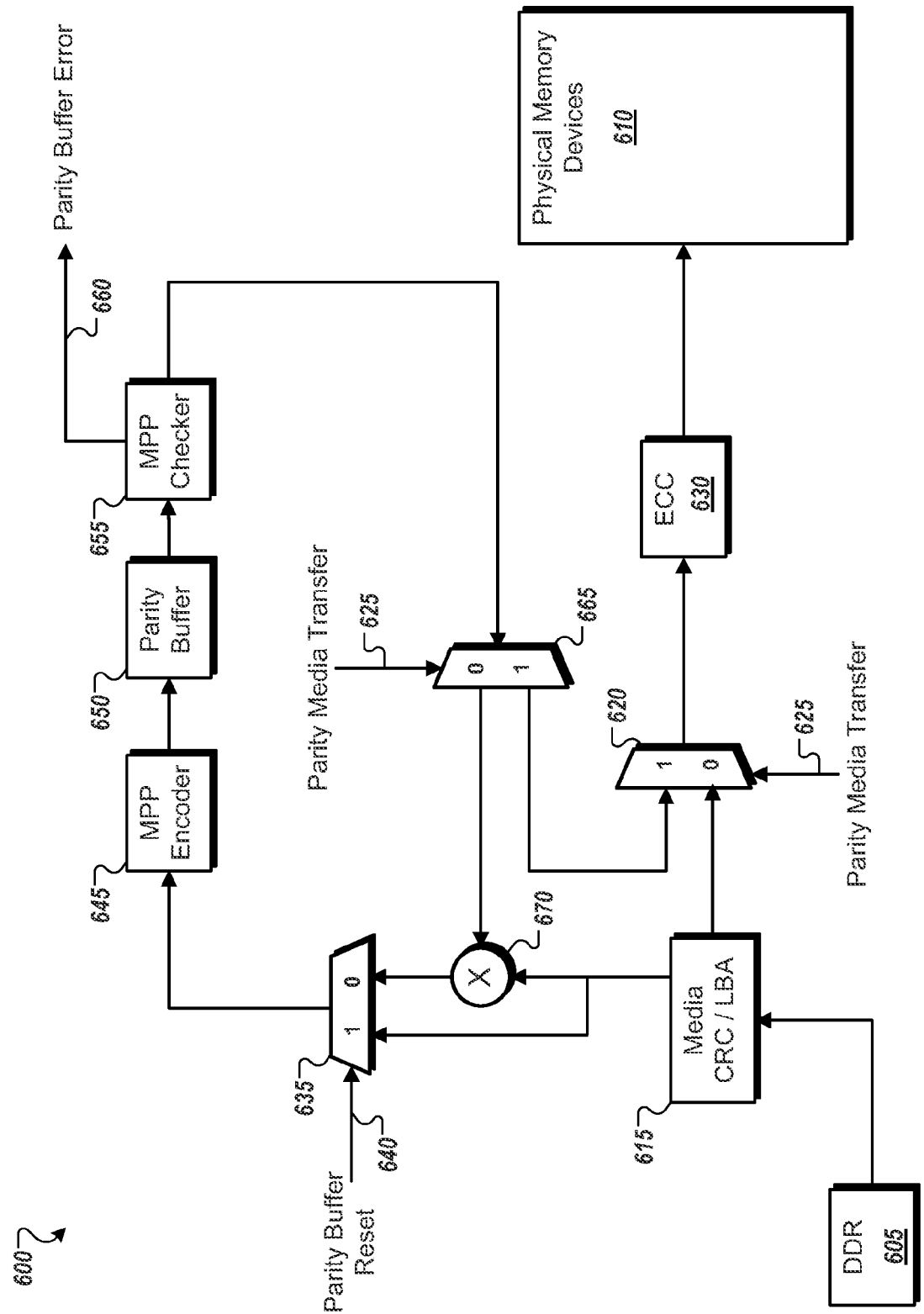
FIG. 6 is a schematic diagram showing an example of a storage controller configured to write data to a physical memory.

FIG. 6 is a schematic diagram showing an example of a storage controller 600 configured to write data to a physical memory. In some implementations, the storage controller 600 can be the storage controller 110 of FIG. 1, the storage controller 210 of FIG. 2, or the storage controller 310 of FIG. 3.

The storage controller 600 includes a double data rate (DDR) memory 605 which buffers user data sent from a host device (not shown) for storage in a collection of physical memory devices 610. Pages of user data buffered in the DDR 605 are processed by a media CRC/LBA 615. In some implementations, the media CRC/LBA 615 may perform cyclical redundancy checks, logical block addressing, or both for pages of user data.

Pages of user data are received at a switch 620 that is controlled by a signal received from the host through a parity media transfer signal 625. When no such signal is present, the user pages are processed by an ECC 630 and stored in a logical block grouping within the physical memory devices 610.

Pages of user data emerging from the media CRC/LBA 615 are also received at a switch 635 that is controlled by a signal received from the host through a parity buffer reset signal 640. When the parity buffer reset signal 640 is present, the user page is processed by a memory protection parity (MPP) encoder 645 that determines a CRC value for the data to be stored in the parity buffer 650. When parity buffer reset signal is not present, MPP encoder receives XOR of the incoming user page with the content of parity buffer (e.g., representing new running RAIB parity). The user page and CRC is then buffered in a parity buffer 650. A MPP checker module 655 uses the CRC value to determine if the data was corrupted while it was stored in parity buffer 650. If the MPP checker module 655 detects an error in the comparison value, then a parity buffer error signal 660 is set to notify the host of the problem in the comparison value.

The parity media transfer signal 625 also controls a switch 665. In general, the parity media transfer signal 625 is set by the memory device controller when RAIB parity data for a logical block grouping is ready to be stored in the collection of physical memory devices 610.

When all the user pages in the logical block grouping have been processed, the controller sets the parity media transfer signal 625, thereby causing the switches 665 and 620 to direct the final RAIB parity to be written onto physical memory devices 610.

Subsequent user pages assigned to the same logical block grouping are then XORed with previously buffered values. In the present example, the previously buffered value is XORed with a subsequent user page in an XOR 670 to produce new intermediate RIAB parity values. The controller releases the parity buffer reset signal 640, therefore the switch 635 directs the running RAIB parity to be processed by the MPP encoder 645, buffered as updated running parity values in the parity buffer 650, and checked by the MPP checker module 655. This cycle repeats for each subsequent user page assigned to the logical block grouping.

In some implementations, the RAIB parity data may describe less than an entire logical block grouping. For example, in response to a power down operation, the RAIB encoder may be required to close all opened RAIB stripes by writing corresponding parity buffers to the physical memory devices 610 (e.g., RAIB associations are said to be opened if the content of their parity buffers have not yet been stored). Once the parity buffers are written to the media, all unwritten pages may be marked as invalid. Allowing the host to write data into these pages may necessitate a RAIB parity update operation, which is generally not possible for flash memory devices.

In some implementations, such a limitation may be overcome by allowing the use of more than one parity page per RAIB stripe. For example, the RAIB encoder may close an open RAIB stripe by storing the current content of the parity buffer to the next available memory block and fill unwritten pages in the RAIB stripe. Once the parity page is written to the media, the XOR of all valid pages within the RAIB stripe is a "0" page. If at a later point the RAIB encoder determines that more pages are to be written into the same RAIB stripe, there is no need to read previously written pages. Each time the RAIB encoder reopens a RAIB parity association, it may write the RAIB parity accumulated during that write session alone.

For example, a RAIB stripe may include ten pages (0-9). The RAIB encoder may receive and process three pages of user data, and those pages can be stored as pages 0, 1, and 2. If at this point, the RAIB encoder is requested to close the RAIB association while the stripe is incomplete (e.g., pages 4-9 have not been written), the RAIB encoder can store the current content of the RAIB buffer (e.g., the XOR of pages 0-2) to the next available page in the stripe (e.g., page 3), and mark the remaining pages 4-9 as invalid. Since pages 0-3 XOR to a "0" page, when write operations are resumed there is no need to re-read, XOR, and buffer pages 0-2; the RAIB encoder can begin encoding new pages once again starting at page 4 and store the corresponding RAIB parity for pages 4-8 in page 9. As such, the recovery code stored in page 9 will be usable for recovering any of the pages 0-8.

Figure 7:
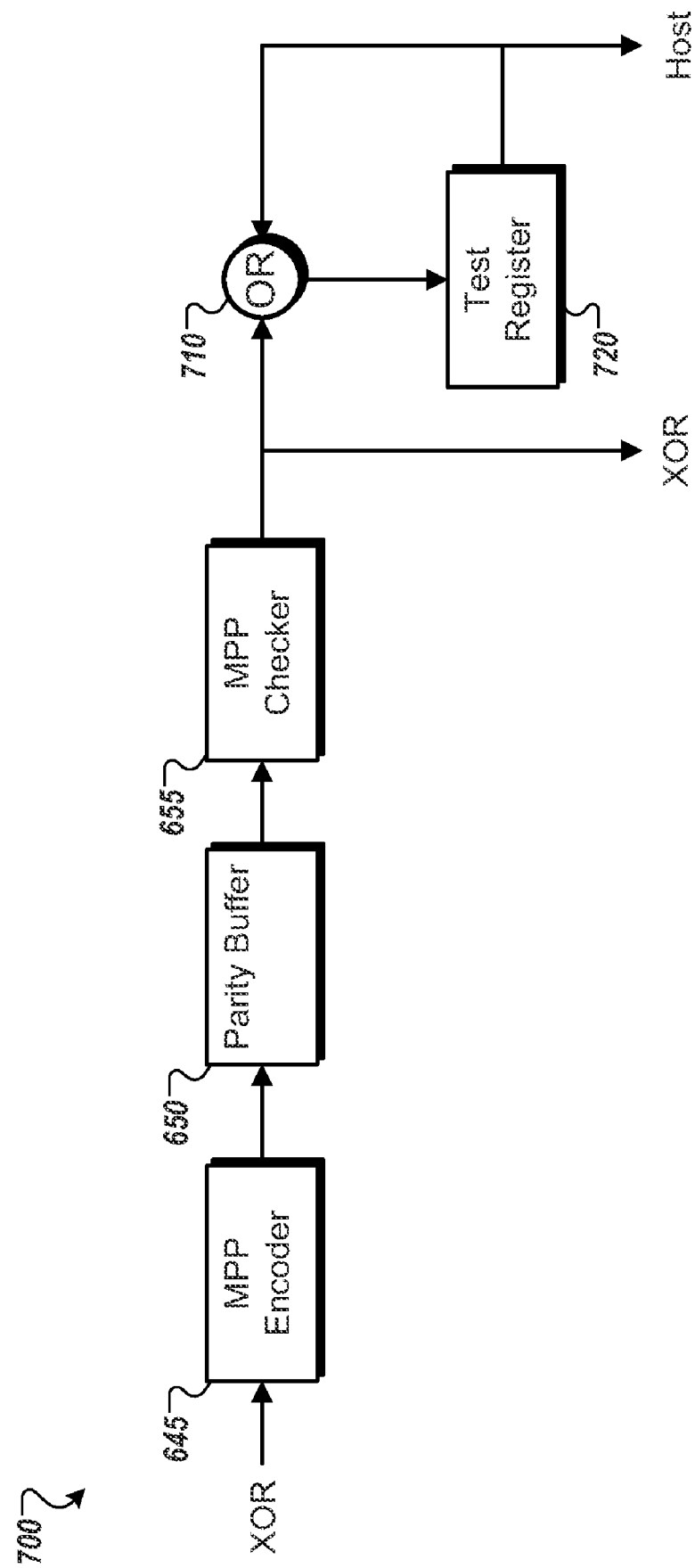
FIG. 7 is a block diagram showing an example of a parity data tester.

FIG. 7 is a block diagram showing an example of a RAIB parity encoder 700 which is capable of performing self-test functions. In some implementations, the self-test functions can be used to automate RAIB feature testing. In general, RAIB functionality may be employed only in the event of a storage device module failure. Since this is a generally rare event, a way to check RAIB structure integrity is provided. In operation, the controller reads all the pages a single RAIB stripe while XOR'ing the contents of the pages as they are read. The normal expectation would be that the parity buffer 650 would be an all "0" page. The content of the parity buffer 650 is checked by logic 710, which XOR's all the bits in the page to determine whether the contents of test register 720 ever become non-zero, which may be indicative of errors in the read pages, possibly due to a storage device failure In case of a storage device module failure, the device controller may attempt to recover the data stored on the failed plane/device. In some implementations, this may be done by reading all the pages in the RAIB stripe, excluding the failed one, and using RAIB ECC to recover the data located on failed devices. More specifically, the failed page can be recovered by XOR'ing remaining pages in the RAIB stripe. In some implementations, if during recovery it is determined that another page in RAIB stripe has failed (e.g. page level ECC failure), then the controller may stop the recovery operation since only one page can be recovered when a single page RAIB recovery code is used. In some implementations, a multi-page recovery RAIB code may be used (e.g., RS ECC) to recover a number of pages equal to or less than the number of pages accommodated by the multi-page recovery code.

Figure 8:
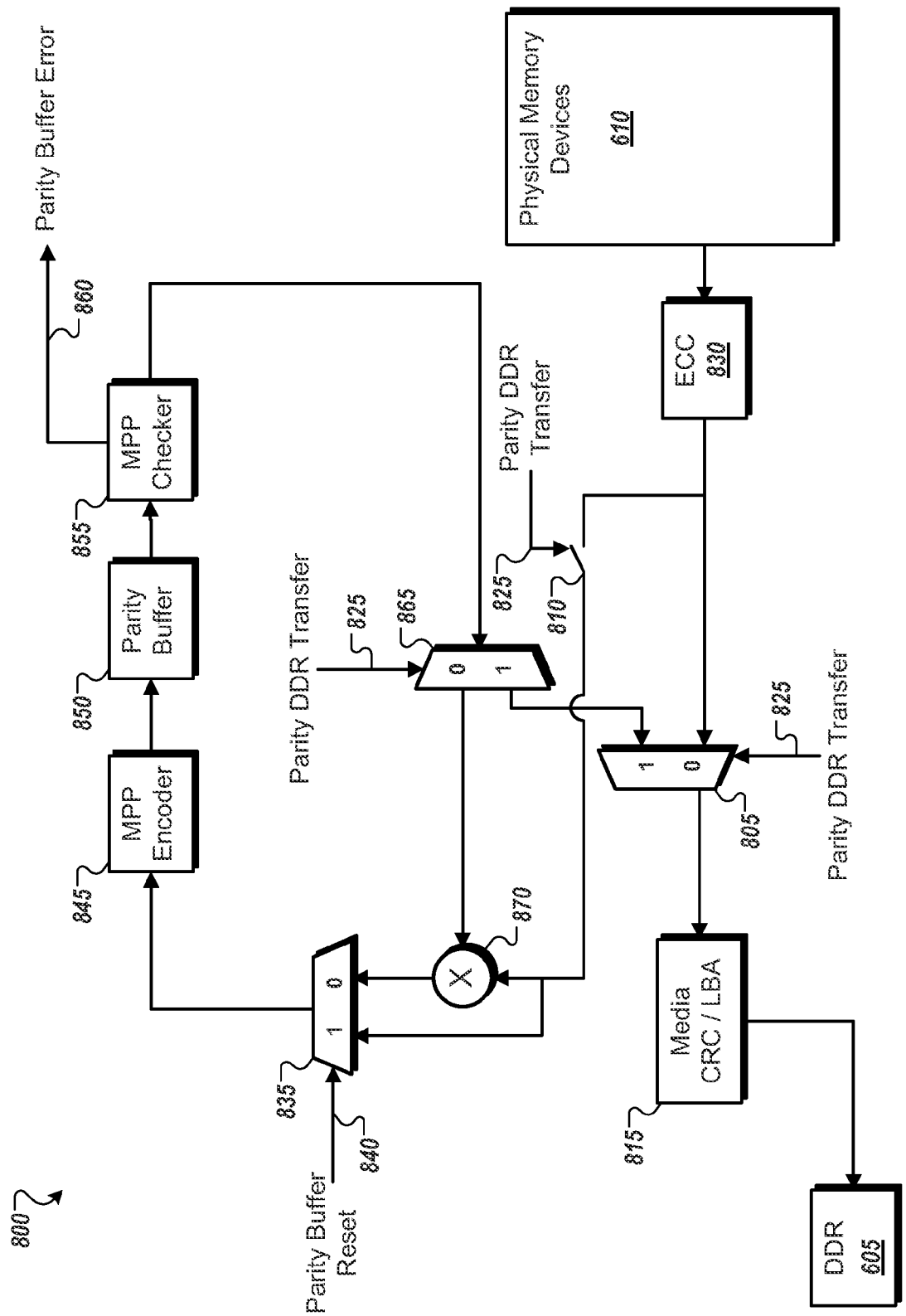
FIG. 8 is a schematic diagram showing an example of a storage controller configured to read data from a physical memory.

FIG. 8 is a schematic diagram showing an example of a storage controller 800 configured to read data from a physical memory. In some implementations, the storage controller 800 may be the storage controller 600 of FIG. 6 in a read configuration. Generally speaking, the circuitry used to read and write to/from the physical memory devices 610 may be separate circuits since they perform different operations (e.g. page level ECC encoder/decoder may operate differently). It may also be preferential to implement separate circuits for the read and write data paths to allow the controller to read and write to/from different ones of the physical memory devices 610 at the same time.

Still speaking in general terms, while the RAIB encoder may be enabled all the time for write operations, the RAIB decoder may be activated only in case a memory failure is detected. Since memory failures are generally rare, these are considered as exceptions in the life of the controller. In some implementations where a memory failure is detected, the controller may stop accepting requests from the host to read or write data until the RAIB data recovery is carried out. In some implementations, the RAIB decoder logic may be substantially the same as that of RAIB encoder, and as such the same circuitry used for both RAIB encoding and decoding (e.g., RAIB encoder hardware may be reused to reduce controller size).

In the present example, pages of stored data within a logical block grouping are read from the collection of physical memory devices 610. A page level ECC 830 checks each page to detect any errors that may be present. In examples of pages where no errors are detected, the host releases a parity DDR transfer signal 825 and the pages flow through a switch 805 to a media CRC/LBA 815 and on to the DDR 605, from which the pages are made available to the host.

In examples where errors are detected, the host sets the parity DDR transfer signal 825, such that a switch 810 directs the error-free pages, including the RAIB redundancy, to a switch 835. A parity buffer reset signal 840 causes the switch 830 to direct the first good page to an MPP encoder 845, and the page is buffered in a parity buffer 850. An MPP checker module 855 checks the content of the parity buffer before passing them back to a switch 865 and an XOR 870.

Subsequently, the host releases the parity buffer reset signal, causing incoming error-free pages of the logical block grouping to be XOR'ed with the content of parity buffer 850. This process is repeated for each of the error free pages in the logical block grouping. At that time the contents of parity buffer 850 represent the page stored on the failed memory block.

The controller then sets the parity DDR transfer signal 825. The signal 825 causes the switches 865 and 805 to direct the recovered data to the host.

Figure 9:
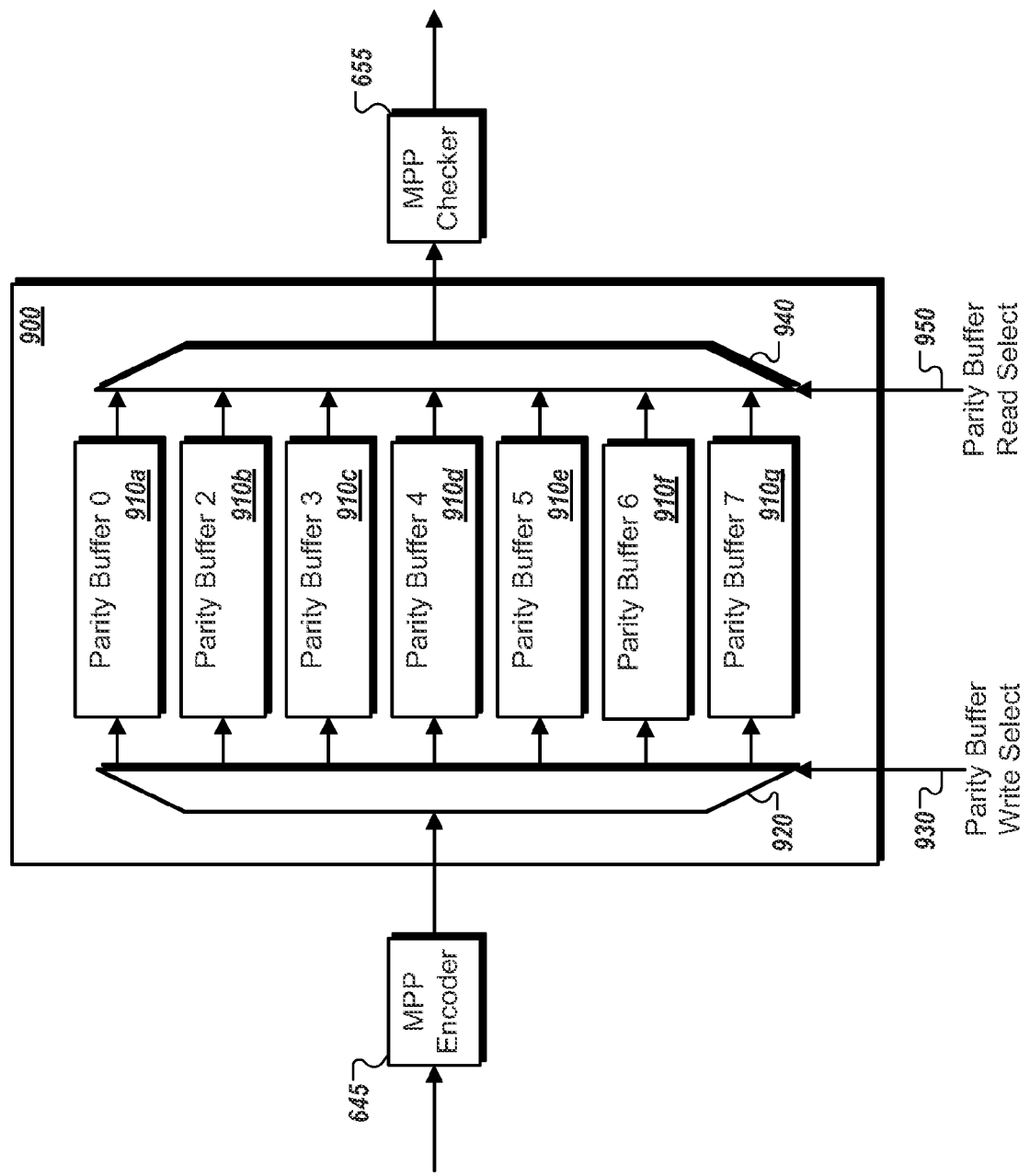
FIG. 9 is a block diagram showing an example of a multiple parity data buffer.

FIG. 9 is a block diagram showing an example of a multiple parity data buffer 900. In some implementations, the multiple parity data buffer 900 can be included in a storage controller, such as the storage controllers 110, 210, and 310. In some implementations, the parity data buffer can be the parity buffer 650 of FIG. 6. In some implementations, fault tolerant solid state memory devices can support multiple logical block groupings to be active (e.g., partly read or written) at the same time. Such implementations can use multiple parity buffers, with one parity buffer being in use for each concurrently active logical block grouping.

The multiple parity data buffer 900 includes a collection of RAIB parity data buffers 910a-910g. In some implementations, each of the RAIB parity data buffers 910a-910g can each save a separate running parity value for a number of active logical block groupings. A switch 920 is configured to selectably route comparison data, checked by the MPP checker module 645, to one of the RAIB parity buffers 910a-910g in response to a write parity buffer select signal 930. In some implementations, the signal 930 may be sent by the host, or by other components of the storage controller in which the 900 is included.

The multiple RAIB parity data buffer 900 also includes a switch 940 that is configured to selectably route buffered running parity data from a selected one of the buffers 910a-910g to the MPP checker module 655 in response to a read parity data buffer select signal 950. In some implementations, the signal 950 may be sent by the storage controller. Note that in some implementations, the buffer 900 includes a single buffer select input for the switches 920, 940; in which case, the select signals 930, 950 are combined into a single buffer select signal.

In some implementations, the single parity data buffers 910a-910g may be double port memories, wherein N buffers may provide up to N active groupings. For example, six double port memories may be implemented to provide up to six active logical block groupings at once.

In other implementations, the single parity data buffers 910a-910g may be single port memories, wherein the operations of reading and writing into the memory are interleaved by reading/writing 2N, where N is number of bits that must be processed in a single clock cycle. For example, twelve single port memories may be implemented to provide up to twelve active logical block groupings at once. Such implementations of single port memory devices may enable greater throughput (e.g., one buffer can be written while another buffer can be simultaneously read).

FIGS. 10A and 10B show examples of a look up table 1000 for mapping logical indexing to physical indexing. In some implementations, the look up table 1000 may be used by a storage controller in conjunction with the multiple parity data buffer 900. Referring to FIG. 10A, the table 1000 is represented in a default mapping configuration (e.g., following a reset operation). A logical index range 1010 of logical buffer locations maps directly to a physical index range 1020 of physical buffer devices in a multiple parity data buffer 900.

The storage controller is able to address "N" logical buffers (e.g., "N" equals six in this example), and the "N+1"th physical buffer is used as a "spare" buffer. In some examples, the storage controller provides a parity buffer active signal to select a logical buffer location. A range 1030 shows the range of logical indexes that can be used by the storage controller. The physical buffer corresponding to the active logical buffer is looked up and activated, for example, by setting the parity buffer read select signal 950. The storage controller may also set the parity buffer write select to the physical buffer corresponding to the spare logical buffer (e.g., physical buffer six in this example).

In some implementations, upon completion of processing of a selected page the look up table 1000 may be modified by updating the buffer corresponding to the selected logical address assigned to the spare buffer, and the buffer corresponding to the logical address "N+1" may be mapped to the physical address given by the parity buffer read select signal. In some implementations, the look up table 1000 may not need to be updated in response to the parity media transfer signal 625 or the parity DDR transfer signal 825.

In some implementations, upon receipt of a reset signal, the look up table 1000 may be updated by setting the parity buffer read select signal 950 to the physical buffer corresponding to logical buffer N+1, and the parity buffer write select signal 930 may be set to the logical buffer location indicated by the parity buffer active signal. For example, when using the previously described technique the storage controller may set the parity buffer active signal equal to 2, the parity buffer read select signal may be set to 2 and the parity buffer write select signal may be set to 6. The look up table 1000, updated in such a way, is shown in FIG. 10b. In some implementations, the look up table 1000 may be implemented in registers to reduce the need for memory protection of the values stored in the table 1000.

Figure 11:
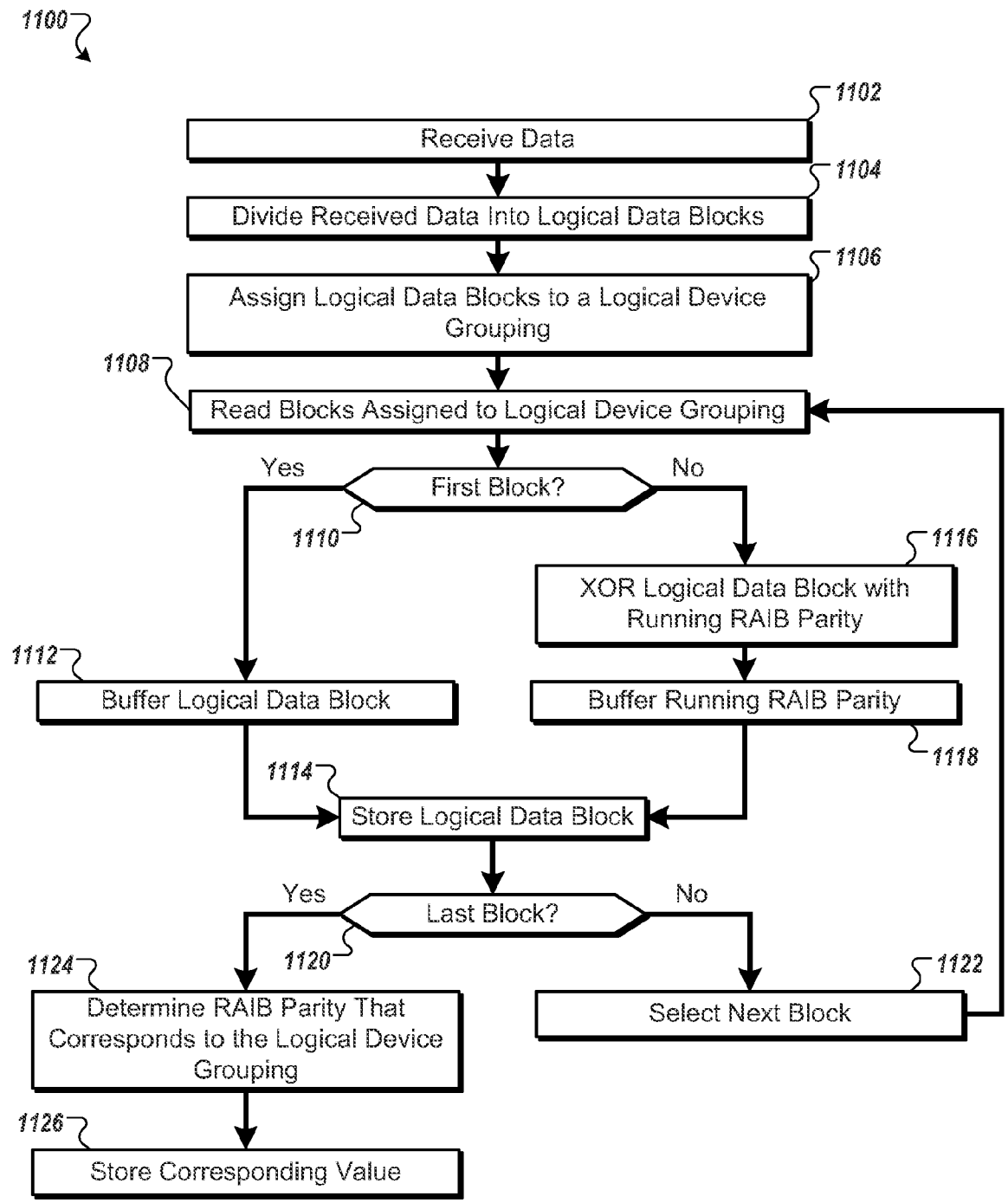
FIG. 11 is a flow diagram showing an example of a process for storing data and error recovery codes.

FIG. 11 is a flow diagram showing an example of a process 1100 for storing data and RIAB parity. In some implementations, the process 1100 may be used by the storage controllers 110, 210, and 310.

At 1102, data to be stored in a solid state memory that includes multiple solid state physical memory devices (e.g., the storage data devices 320a-320f) is received (e.g., at the storage controller 110, from the host 102). At 1104, the received data is divided into logical data blocks that correspond to the solid state memory. For example, the logical data blocks may be the same as the physical data blocks in which the data is to be stored (e.g., the memory blocks 324a-324d).

At 1106, logical data blocks are assigned to at least one logical block grouping including at least one physical data storage block from each of the multiple solid state physical memory devices (e.g., the row 440). At 1108, the data stored in the blocks assigned to the logical block grouping is read.

If, at 1110, the read block is the first logical data block read from the logical block grouping, then at 1112 the logical data block is buffered (e.g., in the parity buffer 650) as a buffered value. The logical data block is then stored (e.g., in a physical memory block corresponding to the logical data block of the logical block grouping) at 1114. If, however, at 1110 the read block is not the first logical data block read from the logical block grouping, then at 1116 the logical data block is XORed with the buffered value (e.g., by the XOR 670) to produce a running RAIB parity. The running RAIB parity is then buffered at 1118 as the buffered value, and the logical data block is stored in physical data storage blocks of the logical block grouping that have been designated for storage of persisted data within the logical block grouping at 1114. In some implementations, multiple buffers (e.g., the multiple parity data buffer 900) may be used to buffer running RIAB parity.

If it is determined at 1120 that the block is not the last logical data block assigned to the logical block grouping, then another block is selected from the logical block grouping at 1122 and read at 1108. If, at 1120, the block is determined to be the last block of the logical block grouping, then a RAIB parity corresponding to the persisted data stored in the logical block grouping is determined at 1124. In some implementations, the RAIB parity may be the last buffered running RAIB parity. At 1126, the corresponding code is stored in at least one physical data storage block of the logical block grouping designated for storage of the code that corresponds to the persisted data stored in the logical block grouping. In some implementations, the corresponding code may be a recovery code (e.g., a parity code, RAIB parity data).

Figure 12:
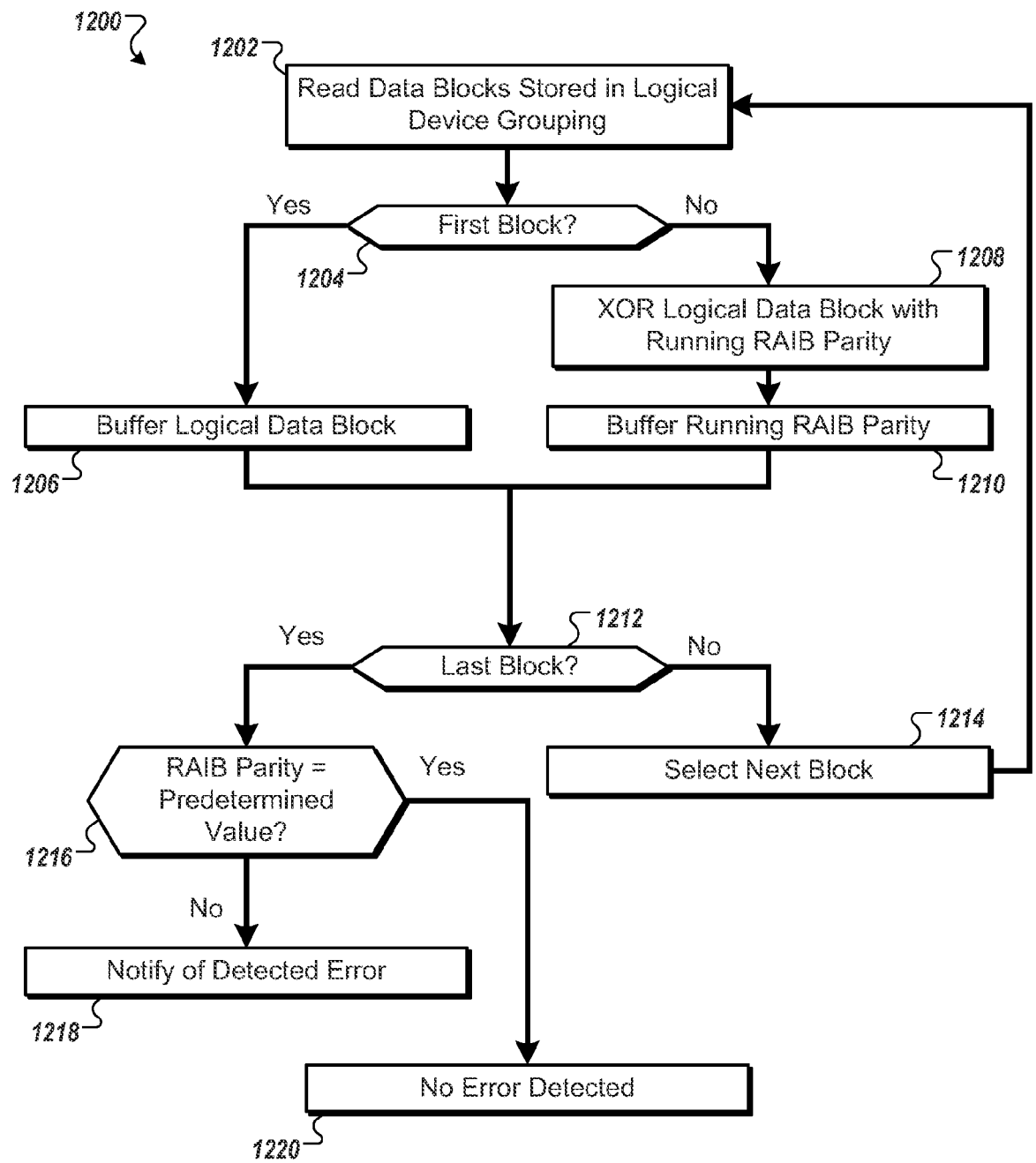
FIG. 12 is a flow diagram showing an example of a process for detecting errors in stored data.

FIG. 12 is a flow diagram showing an example of a process 1200 for detecting errors in stored data. In some implementations, the process 1200 may be used by the storage controllers 110, 210, and 310. At 1202, data stored in the logical data blocks of a logical block grouping within a solid state physical memory (e.g., the storage data devices 320a-320f) is read (e.g., by the storage controller 110).

If at 1204 it is determined that the logical data block is the first block read from the logical block grouping, then the logical data block is buffered at 1206 (e.g., in the parity data buffer 650) as a running RAIB parity. If, however, at 1204, the block is determined not to be the first block read from the logical block grouping, then the block is XORed (e.g., by the XOR 670) to the running RAIB parity at 1208 and buffered at 1210 as the running RAIB parity. In some implementations, multiple buffers (e.g., the multiple parity data buffer 900) may be used to buffer running RAIB parity.

At 1212 a determination is made whether the block is the last block to be read from the logical block grouping. If not, then the next block of the logical block grouping is selected at 1214 and read at 1202. If the block is the last block of the logical block grouping, then at 1216 the running RIAB parity is checked to determine if it is equal to a predetermined value (e.g., zero). If at 1216 the running RIAB parity is determined to be equal to the predetermined value, then no error is detected at 1220. If, however, at 1216 the running RIAB parity differs from the predetermined value, then an error has been detected among the read logical blocks, and a notification of the detected error is given at 1218. In some implementations, the detection of an error within a logical block grouping can be used to trigger a process for recovering the erroneous data.

Figure 13:
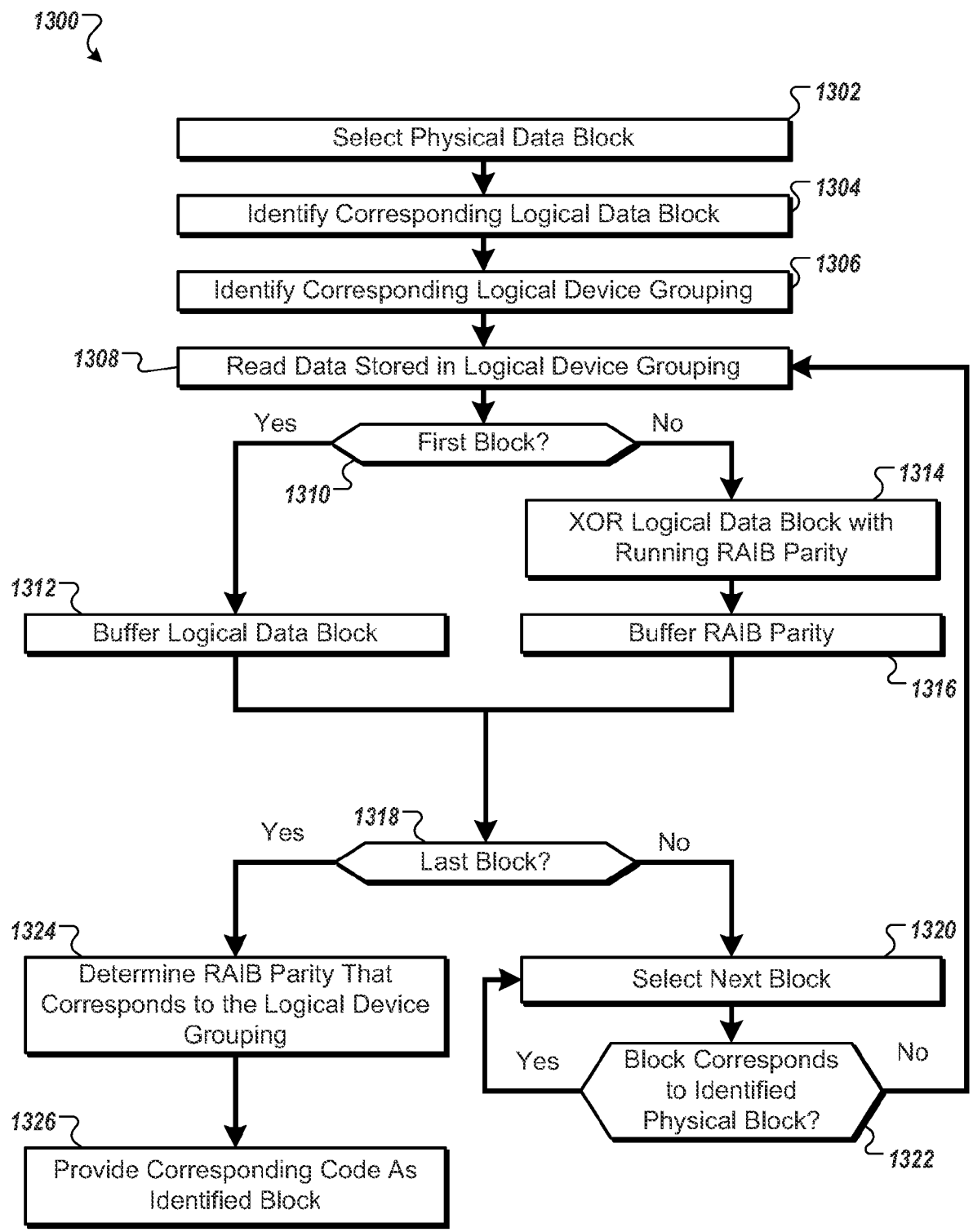
FIG. 13 is a flow diagram showing an example of a process for recovering data.

FIG. 13 is a flow diagram showing an example of a process 1300 for recovering data. In some implementations, the process 1300 may be used by the storage controllers 110, 210, and 310.

At 1302, a physical data block that stores inaccessible or erroneous data is selected (e.g., by the storage controller 110). At 1304, the logical data block that corresponds to the selected physical data storage block is identified. At 1306, the logical block grouping to which the logical data block corresponding to the selected physical data storage block is assigned is identified. At 1308, the persisted data stored in the identified logical block grouping, including the corresponding code (e.g., the recovery code, parity code, RAIB parity data) is read.

If at 1310 it is determined that the read logical data block is the first block read from the logical block grouping, then the logical data block is buffered at 1312 (e.g., in the buffer 650) as a running RAIB parity. However, if at 1310 the logical data block is determined to be a block other than the first block, then at 1314 the logical data block is XORed (e.g., by the XOR 670) to the buffered running RAIB parity. The resulting value is then buffered as the running RAIB parity at 1316. In some implementations, multiple buffers (e.g., the multiple parity data buffer 900) may be used to buffer running RAIB parity.

If at 1318, the logical data block is determined not to be the last block of the logical block grouping, then at 1320 another block of the logical block grouping is selected. If the selected block corresponds to the identified physical block at 1322 (e.g., the block identified at 1302), then another block is selected at 1320. For example, if the newly selected block is the block that has been identified as storing corrupted or inaccessible data, then that block is ignored and another block is selected. Otherwise the selected logical data block is read at 1308.

If, however, at 1318 the logical data block is determined to be the last block of the logical block grouping, then at 1324 a code is determined that corresponds to the logical block grouping. In some implementations, the corresponding code may be the final buffered running RAIB parity. For example, the final parity buffered at 1316 can be used as the code that corresponds to the logical block grouping. For instance, if a first page stored the binary value 01101101, and a second page stored the binary value 11010100, then the XOR of the two pages can be 10111001 and stored as the RAIB parity for the two pages. Should the second page become unreadable, then its contents can be recovered by XORing the RAIB parity 10111001 and the first page value 01101101 to give a value of 11010100, which is the value that was originally stored as the second page.

In some implementations, the corresponding code may a value that, when combined with the final buffered RIAB parity, will result in a predetermined value (e.g., zero). In a simplified example, an 8-bit page size can buffer values from 0 to 255, and for a final value (e.g., buffered at 1316) of 200 and a predetermined value of zero, the corresponding code can be determined to be 56 (e.g., binary 200+binary 56 wraps around to equal a value of zero). At 1326, the corresponding code is provided (e.g., to the host) as the data stored in the selected physical data storage block. Continuing the previous example, the value of 56 can be the value originally stored in the damaged block, and can be provided to the host to recover the data lost in the damaged block.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program can be stored in an electronic memory, on magnetic or optical recording media, or on another appropriate tangible, non-transitory computer-readable medium. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A method comprising:
   receiving, at a storage controller, data to be stored in solid state memory comprising multiple solid state physical memory devices;
   dividing, by the storage controller, the received data into logical data blocks corresponding to the solid state memory;
   assigning, by the storage controller, the logical data blocks to a logical block grouping comprising at least one physical data storage block from two or more of the multiple solid state physical memory devices;
   storing the logical data blocks in physical data storage blocks, of the logical block grouping, designated for storage of persisted data within the logical block grouping;
   determining, by the storage controller, a code that corresponds to the persisted data stored in the logical block grouping; and
   storing, by the storage controller, the code in at least one physical data storage block designated for storage of the code that corresponds to the persisted data stored in the logical block grouping.

2. The method of claim 1, wherein the multiple solid state physical memory devices are FLASH memory devices.

3. The method of claim 1, wherein the determining is a logical XOR operation.

4. The method of claim 1, wherein the multiple solid state physical memory devices and the storage controller comprise a single memory storage device, and the logical block grouping corresponds to a logical block grouping used by the storage controller to carry out memory management in the single memory storage device.

5. The method of claim 1, wherein each of the multiple solid state physical memory devices comprises a single integrated circuit die comprising at least one physical data storage block, wherein a physical data storage block comprises a block of solid state memory formed on the integrated circuit die and is individually addressable along with other blocks of solid state memory formed on the same integrated circuit die.

6. The method of claim 1 further comprising:
   recovering, by the storage controller, the persisted data stored in a selected physical data storage block by identifying the logical block grouping to which the logical data block corresponding to the selected physical data storage block is assigned, reading the persisted data and the code stored in the identified logical block grouping, and comparing the code to the read persisted data other than the persisted data stored in the selected physical data storage block.

7. The method of claim 6, wherein the comparing is a logical XOR operation.

8. The method of claim 1, wherein determining the code comprises:
   storing, in a buffer memory, a first logical data block of the logical block grouping as a buffered value;
   for each of the remaining logical data blocks in the logical block grouping,
      comparing, by the storage controller, the remaining logical data block to the buffered value to determine a comparison value, and
      storing the comparison value as the buffered value in the buffer memory; and
   determining, by the storage controller, a value that, when compared to the buffered value, results in a predetermined value.

9. The method of claim 1, wherein the buffer memory comprises multiple buffer memories, and at least one of the buffer memories comprises a single port memory.

10. An electronic device for storing data, comprising:
    an input port configured to receive data;
    a comparison buffer memory to hold a comparison value;
    a comparison circuit to compare each of multiple logical blocks, into which the data is divided, to the comparison value to determine a new comparison value to hold in the comparison buffer memory; and
    a solid state data storage memory to store the logical blocks and a recovery code corresponding to the comparison value, wherein data from at least one of the stored logical blocks is recoverable by combining data from one or more unselected ones of the stored logical blocks and the recovery code.

11. The device of claim 10, wherein the solid state data storage memory is a FLASH memory.

12. The device of claim 10, wherein the comparison circuit performs a logical XOR operation.

13. The device of claim 10, wherein the buffer memory comprises multiple buffer memories, and at least one of the buffer memories comprises a single port memory.

14. The device of claim 10, wherein the recovery code is determined by determining a value that, when compared to the comparison value, results in a predetermined value.

15. The device of claim 10, comprising a processor programmed by software to effect the comparison circuit.

16. The device of claim 15, wherein the comparison circuit performs a logical XOR operation.

17. The device of claim 10, wherein the solid state data storage memory comprises multiple solid state physical memory devices.

18. The device of claim 17, wherein each of the multiple solid state physical memory devices comprises a single integrated circuit die comprising at least one physical data storage block, wherein a physical data storage block comprises a block of solid state memory formed on the integrated circuit die and is individually addressable along with other blocks of solid state memory formed on the same integrated circuit die.

19. The device of claim 17, wherein the device interfaces with a host device as a single data storage device.

20. A method comprising:
    receiving a request for data stored in solid state memory comprising multiple solid state physical memory devices;
    identifying, by a storage controller, a logical block grouping for logical data blocks of the requested data, the logical data blocks corresponding to the solid state memory, and the logical block grouping comprising at least one physical data storage block from two or more of the multiple solid state physical memory devices;
    reading stored data and a code stored in the identified logical block grouping; and
    comparing the code to the stored data to assess the requested data.

* * * * *